(12) United States Patent
Barnes

(10) Patent No.: US 6,369,632 B1
(45) Date of Patent: Apr. 9, 2002

(54) CMOS SWITCHING CIRCUITRY

(75) Inventor: William Bryan Barnes, Bristol (GB)

(73) Assignee: STMicroelectronics Limited, Almondsbury Bristol (GB)

( * ) Notice: Subject to any disclaimer, the term of this patent is extended or adjusted under 35 U.S.C. 154(b) by 0 days.

(21) Appl. No.: 09/643,064

(22) Filed: Aug. 21, 2000

(30) Foreign Application Priority Data

Aug. 25, 1999 (GB) .............................................. 9920172

(51) Int. Cl.⁷ .............................................. H03K 3/356
(52) U.S. Cl. ...................................... 327/211; 327/333
(58) Field of Search ........................... 327/55, 57, 199, 327/201, 208, 210–219, 333, 427, 433, 434, 436, 437

(56) References Cited

U.S. PATENT DOCUMENTS

| | | | | |
|---|---|---|---|---|
| 5,148,061 A | * | 9/1992 | Hsueh et al. | 327/211 |
| 6,026,011 A | * | 2/2000 | Zhang | 365/154 |
| 6,084,459 A | * | 7/2000 | Jeong | 327/219 |
| 6,107,853 A | * | 8/2000 | Nikolic et al. | 327/217 |
| 6,242,962 B1 | * | 6/2001 | Nakamura | 327/333 |

FOREIGN PATENT DOCUMENTS

| | | | |
|---|---|---|---|
| EP | 0 487 911 | 6/1992 | ............ G11C/7/06 |
| EP | 0 592 545 | 3/1993 | ....... H03K/19/0185 |
| EP | 0 661 811 | 7/1995 | .......... H03K/3/356 |
| EP | 0 772 302 | 5/1997 | ....... H03K/19/0185 |
| EP | 0 788 235 | 8/1997 | ....... H03K/19/0185 |

OTHER PUBLICATIONS

Standard Search Report performed in the corresponding United Kingdom application.

Alowersson J., et al., *622 MHZ Current–Mode Sense Amplifier*, Electronics Letters, GB, IEE Stevenage, vol. 32, No. 3, Feb. 1, 1996, XP000554907, ISSN: 0013–5194.

* cited by examiner

*Primary Examiner*—My-Trang Nu Ton
(74) *Attorney, Agent, or Firm*—Wolf, Greenfield & Sacks, P.C.; James H. Morris; Robert A. Skrivanek, Jr.

(57) ABSTRACT

A flip-flop circuit comprises a pair of cross-coupled inverters, each of which has a respective FET connected in series between it and the reference terminal, each inverter driving a transistor of an output inverter.

14 Claims, 1 Drawing Sheet

CMOS SWITCHING CIRCUITRY

FIELD OF THE INVENTION

The present invention relates to CMOS switching circuitry, and more specifically but not exclusively to CMOS level shift circuitry.

BACKGROUND TO THE INVENTION

The art is replete with level shift circuitry providing an output at a different voltage level to the input.

In an integrated circuit using CMOS technology it is desirable to use p FETs and n FETS. A difficulty may arise in that the relative current carrying ability of the p FETs and n FETs may vary from chip-to-chip. Where the level shifting circuitry requires a particular relationship between p FETs and n FETs to operate properly, difficulties may arise. For example, where the pull-up of an output node is provided by a p FET and the pull-down by an n FET the circuit may operate too slowly under certain tolerance conditions.

It is accordingly an object of the present invention to at least partially mitigate the difficulties of the prior art.

SUMMARY OF THE INVENTION

According to a first aspect of the present invention there is provided a CMOS switching circuit comprising input circuitry and output circuitry, said input circuitry having a first input switch and a second input switch, each input switch being connected to an input terminal, a pair of cross-coupled CMOS inverters forming bistable circuitry, said bistable circuitry connectable to a power terminal and having a first and a second branch, said first branch being connectable to a reference terminal via said first input switch and said second branch being connectable to said reference terminal via said second input switch, said output circuitry being connected to said bistable circuitry for providing a circuit output.

Preferably said first input switch has a control node coupled directly to said input terminal and said second switch has a control node coupled to said input terminal via a first inverter, whereby drive to said input switches is complementary.

Advantageously each of said CMOS inverters has a respective common gate, the common gate of the CMOS inverter of the first branch and the common gate of the CMOS inverter of the second branch being connected to said output circuitry.

Conveniently the two CMOS inverters have a common source terminal connectable to said power terminal via a power switch.

Advantageously said power switch is a p FET.

Advantageously the output circuitry comprises an output p FET having a gate coupled to the common gate of said CMOS inverter of the first branch via a further inverter, and an output n FET having a gate coupled to the common gate of said CMOS inverter of the second branch, the output p FET and the output n FET having a common source/drain terminal.

Preferably the common gates of the CMOS inverters of said first and second branches are connected to said reference terminal via respective equalization switches.

Advantageously said common source/drain terminal is connected to a circuit output terminal via cross-coupled output inverters.

Conveniently the cross-coupled output inverters comprise a forward inverter and a relatively weak feedback inverter.

Conveniently the power switch has a control node connected in common with the control nodes of the equalization switches.

Preferably a voltage supply to said input circuitry differs from a voltage supply to said output circuitry whereby said circuit output is level shifted.

BRIEF DESCRIPTION OF THE DRAWINGS

An embodiment of the invention will now be described, by way of example only, with reference to the accompanying drawing which shows a schematic diagram of an embodiment of a CMOS switching circuit in accordance with the invention.

DESCRIPTION OF THE PREFERRED EMBODIMENT

Figure 1:
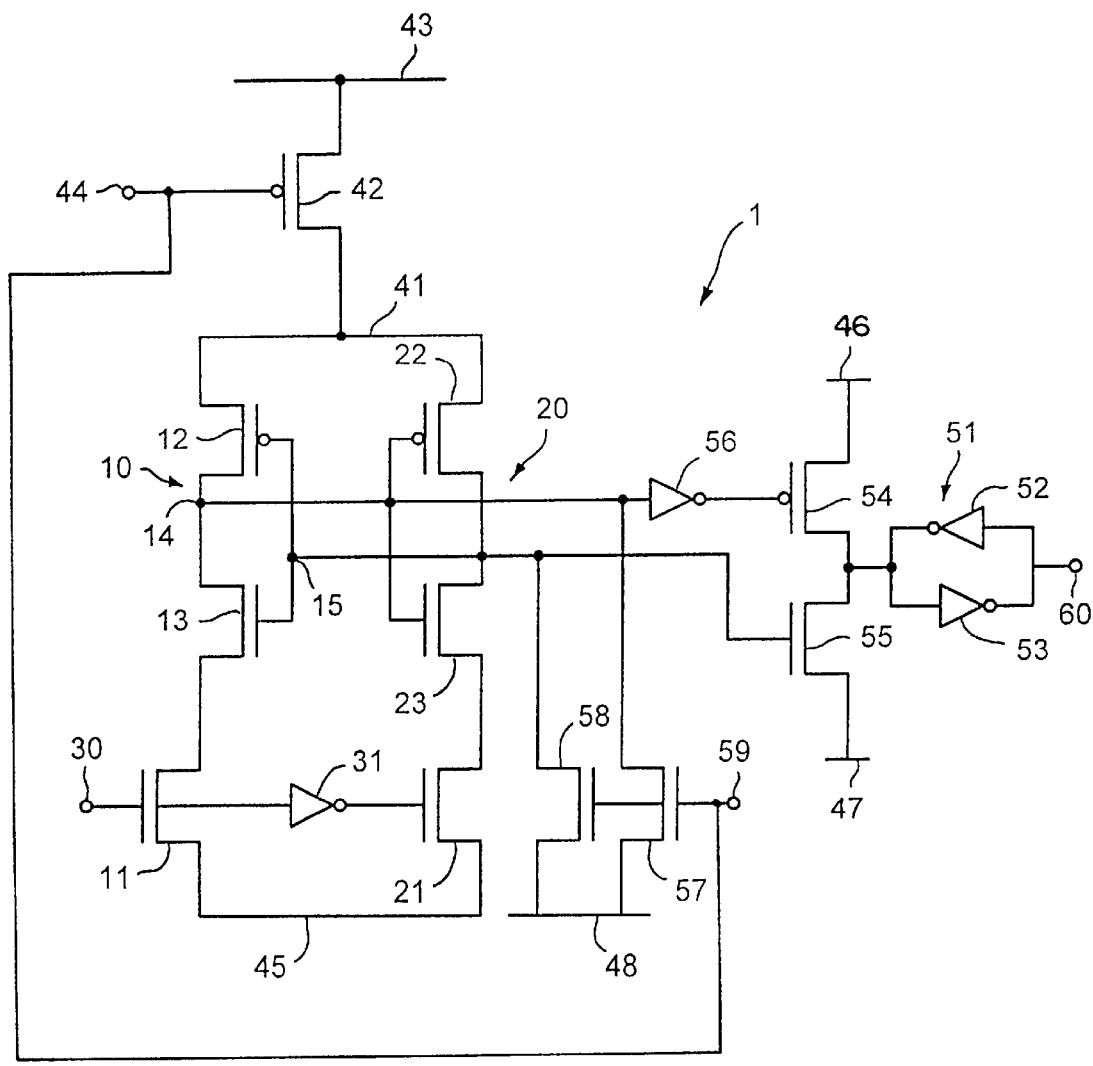

A level shifting flip-flop 1 consists of a first input switch 11, which is an n FET having a source terminal connected to a first negative supply terminal 45 and a gate terminal connected to an input terminal 30, and a second input switch 21, which is likewise an n FET having a source terminal connected to the first negative supply terminal 45. The second input switch 21 has a control gate coupled to the input terminal 30 via an input inverter 31 so that the drive to the input switches is complementary whereby one input switch is on, the other is off. The first input switch 11 further has a drain node connected to a circuit node 41 via a first CMOS inverter 10 while the second input switch 21 has a drain node connected to the circuit node 41 via a second CMOS inverter 20. The first CMOS inverter 10 consists of an n FET 13 having a source/drain terminal connected to the drain of the first input switch 11, a drain/source terminal connected to a drain/source terminal of a p FET 12, which has a source/drain terminal connected to the circuit node 41. The gates of the p and n FETs 12, 13 of the first CMOS inverter 10 are connected in common at a first gate node 15.

Similarly, the second CMOS inverter consists of an n FET 23 having a source/drain terminal connected to the drain terminal of the second input switch 21, and a drain/source terminal connected to a drain/source terminal of a p FET 22, which in turn has a source/drain terminal connected to the circuit node 41. The gates of the p and n FETs 22, 23 of the second CMOS inverter 20 are connected in common at a second gate node 14.

The first gate node 15 is further connected to the common source/drain terminals of the second CMOS inverter 20 and the second gate node 14 is connected to the common source/drain terminals of the first CMOS inverter 10.

The first gate node 15 is also connected directly to the gate of an output n FET 55, which has a source terminal connected to a second negative supply terminal 47, and a drain terminal. The second gate node 14 is connected via a further inverter 56 to the gate of an output p FET 54 having a source connected to a first power supply terminal 46 and a drain connected to the drain of the output n FET 55. The common terminal of the output p and n FETs is connected to an output terminal 60 via an output inverter 51 which comprises a forward inverter 53 and a feedback inverter 52, the feedback inverter 52 being weak by comparison with the forward inverter 53.

The first gate node 15 is connectable to a third negative supply terminal 48 via a first equalization transistor 58, which is an n FET and the second gate node 14 is connectable to the third negative supply terminal 48 via a second equalization transistor 57, which is a similar n FET. The two equalization transistors have a common control terminal 59.

The circuit node 41 is connectable to a second power supply terminal 43 via a power supply switch 42, in the form of a p FET having a source/drain terminal connected to the power supply terminal and a drain/source terminal connected to the circuit node 41. The gate of the power supply switch is connected to a clock terminal 44.

The operation of the circuit 1 will now be described:

To provide level shifting, the power supply terminals 43 and 46 are typically supplied with different positive supply voltages, with the negative supply terminals 45,47, and 48 being connected in common. Alternatively, or as well, the first negative supply terminal 45 may be at a different potential to the second and third terminals 47, 48.

The clock terminal 44 and the equalization transistor control terminal 59 are supplied with a clock signal such that while the clock is at a logic low the circuit 1 is active and while the clock is at a logic high the circuit 1 is inactive. With the clock at a logic low, (circuit active) assume that the first gate node 15 is at a high potential. Due to the cross-coupling of the two CMOS inverters 10, 20 this means that the second gate node 14 is at a low potential with the n FET 13 of the first inverter in a conductive condition and the p FET 22 of the second inverter likewise in a conductive condition. Thus, the output n FET 55 will be on and the output p FET 54 will be off. Hence the output terminal 60 will be high.

This condition corresponds to the input terminal 30 being at a high potential which causes the first input switch 11 to be conductive and the second input switch 21 to be non conductive.

When the clock pulse makes its transition to a logic high state the circuit node 41 becomes disconnected from the power supply at terminal 43 and the equalization transistors 57 an 58 are turned on thus supplying an off signal to both the p and n output FETs 54 and 55. The common terminal of these output transistors thus goes to a high impedance or tristate and the output terminal GO remains in its previous state.

If the input terminal changes to a low potential, this causes the first input switch 11 to be rendered non-conductive and the second input switch 21 to be rendered conductive. Then, when the clock signal once again assumes its logic low state, the circuit node 41 becomes again connected to the power supply terminal 43 and the equalization transistors 57 and 58 turn off. The "off" state of the first input switch 11 means that the first inverter 10 is pulled up towards the positive supply and the common node between the p transistor 12 and the n transistor 13 goes high. This node is connected to the second gate node 14 of the second CMOS inverter 20 which is in turn being connected to the first negative supply terminal 45 via the on second switch 21. The result is that the n transistor 23 of the second CMOS inverter 20 turns on which in turn positively pulls the first gate node 15 of the first inverter to a low level, turning on the p FET 12 of the CMOS inverter 10.

The application of a low potential at the first gate node 15 to the output circuit causes the output n transistor 55 to turn off. The application of a high potential at the second gate node 14 causes, via the inverter 56, a low potential to be applied to the p output FET 54 which then turns on pulling the common output node of the output p and n FETs high to the potential on the supply terminal 46, and causing the output terminal via the output inverter 51 to go low.

Once again the clock signal goes to a logic high state isolating the circuit node 41 from the power supply terminal 43 and equalizing the potential at the gate nodes 14 and 15 to the reference level at supply terminal 48. The output inverter again goes to a tristate and the output terminal 60 remains at an unchanged potential.

When the input terminal 30 is again at logic high the in put switch 11 will be turned on and the second input switch 21 will be turned off and when the clock signal returns to its logic low state, transistor 13 will turn on driving the second gate node 14 low, turning the p FET 22 of the second CMOS inverter on so that the above-described first state will pertain.

From a review of the above description of operation it will be seen that at no stage is the relative current carrying capability of PMOS and NMOS transistors compared. Moreover, there is no static flow of current at any time.

What is claimed is:

1. A CMOS switching circuit comprising input circuitry and output circuitry, said input circuitry having a first input switch and a second input switch, each input switch being connected to an input terminal, a pair of cross-coupled CMOS inverters forming bistable circuitry, said bistable circuitry connectable to a power terminal and having a first branch and a second branch, said first branch being connectable to a reference terminal via said first input switch and said second branch being connectable to said reference terminal via said second input switch, said output circuitry being connected to said bistable circuitry for providing a circuit output;

wherein each of said CMOS inverters has a respective common gate, the common gate of the CMOS inverter of said first branch and the common gate of the CMOS inverter of said second branch being connected to said output circuitry;

wherein the common gates of the CMOS inverters of said first and second branches are connected to said reference terminal via respective equalization switches each having a control node;

wherein each of said CMOS inverters has a common source terminal connectable to said power terminal via a power switch; and wherein said power switch has a control node connected in common with the control nodes of the equalization switches.

2. A circuit as claimed in claim 1 wherein said first input switch has a control node coupled directly to said input terminal and said second switch has a control node coupled to said input terminal via a first inverter, whereby drive to said input switches is complementary.

3. A circuit as claimed in claim 1, wherein said power switch is a p FET.

4. A circuit as claimed in claim 1, wherein said output circuitry comprises an output p FET having a gate coupled to the common gate of the CMOS inverter of said first branch via a further inverter, and an output n FET having a gate coupled to the common gate of the CMOS inverter of said second branch, the output p FET and the output n FET having a common source/drain terminal.

5. A circuit as claimed in claim 4 wherein said common source/drain terminal is connected to a circuit output terminal via cross-coupled output inverters.

6. A circuit as claimed in claim 5 wherein the cross-coupled output inverters comprise a forward inverter and a relatively weak feedback inverter.

7. A circuit as claimed in claim 1 wherein a voltage supply to said input circuitry differs from a voltage supply to said output circuitry whereby said circuit output is level shifted.

8. A CMOS switching circuit comprising input circuitry and output circuitry, said input circuitry having a first input switch and a second input switch, each input switch being connected to an input terminal, a pair of cross-coupled CMOS inverters forming bistable circuitry, said bistable circuitry connectable to a power terminal and having a first and a second branch, said first branch being connectable to a reference terminal via said first input switch and said second branch being connectable to said reference terminal via said second input switch, said output circuitry being connected to said bistable circuitry for providing a circuit output;

wherein each of said CMOS inverters has a respective common gate, the common gate of the CMOS inverter of said first branch and the common gate of the CMOS inverter of said second branch being connected to said output circuitry; and wherein said output circuitry comprises an output p FET having a gate coupled to the common gate of the CMOS inverter of said first branch via a further inverter, and an output n FET having a gate coupled to the common gate of the CMOS inverter of said second branch, the output p FET and the output n FET having a common source/drain terminal.

9. A circuit as claimed in claim 8, wherein the common gates of the CMOS inverters of said first and second branches are connected to said reference terminal via respective equalization switches.

10. A circuit as claimed in claim 8, wherein said common source/drain terminal is connected to circuit output terminal via cross-coupled output inverters.

11. A circuit as claimed in claim 10, wherein the cross-coupled output inverters comprise a forward inverter and a relatively weak feedback inverter.

12. A circuit as claimed in claim 8, wherein a voltage supply to said input circuitry differs from a voltage supply to said output circuitry whereby said circuit output is level shifted.

13. A circuit as claimed in claim 8, wherein said first input switch has a control node coupled directly to said input terminal and said second switch has a control node coupled to said input terminal via a first inverter, whereby drive to said input switches is complementary.

14. A CMOS switching circuit comprising input circuitry and output circuitry, said input circuitry having a first input switch and a second input switch, each input switch being connected to an input terminal, a pair of cross-coupled CMOS inverters forming bistable circuitry, said bistable circuitry connectable to a power terminal and having a first and a second branch, said first branch being connectable to a reference terminal via said first input switch and said second branch being connectable to said reference terminal via said second input switch, said output circuitry being connected to said bistable circuitry for providing a circuit output;

wherein a voltage supply to said input circuitry differs from a voltage supply to said output circuitry whereby said circuit output is level shifted.

* * * * *